(12) United States Patent
Cercelaru

(10) Patent No.: US 8,723,601 B2
(45) Date of Patent: May 13, 2014

(54) AMPLIFIER

(71) Applicant: Cambridge Silicon Radio Limited, Cambridge (GB)

(72) Inventor: Sever Cercelaru, Cannes-la-Bocca (FR)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 13/675,330

(22) Filed: Nov. 13, 2012

(65) Prior Publication Data

US 2013/0135050 A1 May 30, 2013

(30) Foreign Application Priority Data

Nov. 29, 2011 (GB) .................................. 1120538.2

(51) Int. Cl.
*H03F 3/26* (2006.01)

(52) U.S. Cl.
USPC .......................................... 330/276; 330/253

(58) Field of Classification Search
USPC .................. 330/252–261, 195, 276
See application file for complete search history.

(56) References Cited

U.S. PATENT DOCUMENTS

| 6,359,513 | B1 | 3/2002 | Kuo et al. |
| 7,397,305 | B2 * | 7/2008 | Kim et al. ..................... 330/146 |
| 2010/0253310 | A1 | 10/2010 | Fonderie |
| 2011/0241781 | A1 | 10/2011 | Owen et al. |

OTHER PUBLICATIONS

GB Search Report for GB Appln. No. 1120538.2, dated Mar. 6, 2013.

* cited by examiner

*Primary Examiner* — Hieu Nguyen
(74) *Attorney, Agent, or Firm* — RatnerPrestia

(57) ABSTRACT

A differential electronic amplifier including: a first switch connected between a first reference voltage and a first node; a second switch connected between a second reference voltage and a second node; a resonant differential load connected between the first and second nodes and having a centre point connected to a third reference voltage; an output stage constituted by a first side of a transformer; a load impedance connected to a second side of the transformer; a first capacitive element connected between the first side of the transformer and the first node; and a second capacitive element connected between the first side of the transformer and the second node; wherein all inductive elements connected in series between the first and second capacitive elements are inductively coupled to the second side of the transformer.

6 Claims, 8 Drawing Sheets

AMPLIFIER

BACKGROUND OF THE INVENTION

In the field of electronic amplification it is often necessary to optimise efficiency, fidelity, device size and cost. For example radio frequency amplifiers are often implemented in mobile devices, requiring them to be extremely efficient to improve battery life, high fidelity to provide good quality signals, very small (preferably implemented all on one integrated circuit chip) to reduce the size and weight of the device, and low-cost (again a fully integrated solution is useful here).

One simple type of amplifier is the class-B push-pull stage amplifier. In amplifiers of this type complimentary or quasi-complementary devices are each used for amplifying opposite halves (positive/negative) of the input signal. The outputs of the devices are combined to yield an overall output. This is an efficient arrangement, however there can be a small mismatch in the cross-over region at the "joins" between the two halves of the signal, as one output device has to take over supplying power exactly as the other finishes. This is called crossover distortion. An improved version is the class-AB amplifier. In class-AB operation the devices are biased so they are not completely off when not in use. Each device operates the same way as in Class B over half the waveform, but also conducts a small amount over the other half. As a result, the region where both devices simultaneously are nearly off is reduced. The result is greatly reduced crossover distortion. The specific implementation of Class-AB for high frequency operation (RF) uses active devices with tuned load (L-C tank) instead of complementary devices for improved head-room and frequency selectivity.

Amplifiers are often made to be differential in order to improve fidelity. Differential amplifiers typically work by employing two electronic amplifiers, measuring the difference between their inputs and multiplying this difference by a constant factor. This provides the advantage of effectively cancelling out voltages which are common to the outputs of amplifiers, producing an output signal having reduced harmonics level and dc offset voltages. An additional benefit of using a differential configuration, especially in high frequency implementations, is that available voltage swing is doubled compared to the corresponding single-ended implementation. This makes it possible to achieve larger output powers for a given impedance load, or to achieve a given output power on a larger load impedance.

Fully integrated differential class-AB amplifiers are known. These do however have drawbacks. For implementations where large current handling is required the tracks on any circuit board that carries the current must be very large to prevent electromigration and overheating (which if allowed would be both inefficient and dangerous). In radio frequency implementations, transformers called baluns are often used for coupling to the load. Large tracks mean that a high coupling coefficient cannot be obtained for magnetic coupling to the load and any balun that is used at the output cannot then be readily optimised. Therefore the combined load and balun structure typical of radio frequency class-AB differential power amplifiers is not ideal as it prevents simultaneous optimisation of quality factor and magnetic coupling.

An improvement of the class-AB amplifier is the class-E power amplifier. This uses resonant load at the working frequency for switching mode operation, and resonant load coupling for removing power dissipated on the harmonics. Due to their relatively simplistic design and good high-frequency performance, class-E amplifiers are regularly employed to amplify constant-envelope waveforms, where the transmitted carrier power is constant. A typical class E amplifier known in the art is shown in FIG. 1.

In the amplifier shown in FIG. 1, current passes through inductor L3 and through transistor MØ which operates as a switch driven by the signal to be amplified at V1. Capacitor C2 is placed in parallel with transistor MØ. C2 resonates the load at the operating frequency. Capacitor C1 and inductor L5 are placed in series together resulting in a tuned series LC circuit. This circuit is in series with another LC circuit formed by L4 and C5, having a reactive component $j_{L4C5}$ and load impedance $R_{L4C5}$.

As transistor MØ is periodically switched on and off by the input signal, the C1-L5 filter is tuned to the first harmonic of the input frequency and only allows through a sinusoidal current to load RØ.

L4 and C5 are the impedance matching circuit, so the load impedance RØ is transformed (step-up or step-down) to the desired level for the amplifier, or internal impedance, Rint. The maximum output power (Pout,max) is:

$$Pout, \max = \frac{Veff^2}{Rint} = Rint * Ieff^2 \qquad (1)$$

Where Ieff is the effective current and Veff is the available voltage for single-ended amplifiers with inductive load:

$$Veff = \frac{(Vdd - Vd, sat)}{\sqrt{2}} \qquad (2)$$

Where Vd,sat is the saturation voltage of the active device MØ. For a given load impedance and supply voltage, impedance transformation is needed to achieve the desired output power:

$$R\phi * Rsource = \frac{L4}{C5} \qquad (3)$$

$$F_{rf} = \frac{1}{2*\pi*\sqrt{L4*C5}} \qquad (4)$$

Where $F_{rf}$ is the working frequency of the amplifier.

The pair of resonant LC circuits creates a damped oscillation across the load of the amplifier. By using particular values for the components of the resonant LC circuits, a frequency of the damped oscillation can be chosen that ensures that the voltage across the transistor is low when the current is high, and the voltage is high across the transistor when the current is low. As power efficiency is usually determined according to the energy wasted in the process of amplifying a signal, the efficiency of an amplifier can be improved if the power across the transistor is minimised.

Differential class-E amplifiers are known, having the advantages of the good high-frequency performance of a simple class-E amplifier, together with those of a differential amplifier: common-mode and harmonics rejection, and increased voltage swing for a given supply FIG. 2 shows an example of a differential class-E amplifier as derived from the single-ended structure of FIG. 1, with no optimisation excepting differential resonance of the load L3+L9 by C2. That is, in FIG. 2, two class-E amplifiers of the type shown in FIG. 1 are combined such that their respective outputs are connected.

In FIG. 2 the left-hand amplifier is largely the same as the class-E amplifier of FIG. 1. In the right-hand amplifier: inductor L9 corresponds to inductor L3, input V3 corresponds to input V1, transistor M1 corresponds to transistor MØ, capacitor C3 corresponds to capacitor C1, inductor L8 corresponds to inductor L5, inductor L10 corresponds to inductor L4, and capacitor C4 corresponds to capacitor C5.

The outputs of both amplifiers are connected by inductor L6 which is coupled to the load RØ by inductor L7, forming the output transformer.

This approach needs four inductor components for the harmonic tuning and output matching. As well as these four inductor components, a symmetrical inductance for the power amplifier load, and a transformer/balun for single-ended to differential transformation are also required. The large number of inductors required for this approach makes it undesirable for use in an integrated circuit (IC), as the large number of components will require a large amount of silicon area. Furthermore, it is difficult to pre-estimate inductive couplings between individual inductances. These "crossed" magnetic couplings shift the desired resonance frequency and degrade the impedance transformation.

What is needed is a differential class-E power amplifier with reduced crossed magnetic coupling between inductances and improved quality factor and magnetic coupling to the load, preferably small enough to be integrated on a one-chip implementation.

SUMMARY

According to a first aspect of the invention, there is provided a differential electronic amplifier comprising: a first switch means connected between a first reference voltage and a first node; a second switch means connected between a second reference voltage and a second node; a resonant differential load connected between the first and second nodes and having a centre point connected to a third reference voltage; an output stage constituted by a first side of a transformer; a load impedance connected to a second side of the transformer; a first capacitive element connected between the first side of the transformer and the first node; and a second capacitive element connected between the first side of the transformer and the second node; wherein all inductive elements connected in series between the first and second capacitive elements are inductively coupled to the second side of the transformer.

One or more of said inductive elements may provide impedance matching combining the outputs of two electronic amplifier circuits comprised in the differential electronic amplifier circuit.

The differential electronic amplifier may be implemented on a single integrated circuit and/or in a radio frequency transmitter circuit.

The load impedance may be an antenna. The load impedance may be 50 Ohms.

BRIEF DESCRIPTION OF THE DRAWINGS

Aspects of the present invention will now be described by way of example with reference to the accompanying drawings. In the drawings.

DETAILED DESCRIPTION OF THE INVENTION

The following description is presented to enable any person skilled in the art to make and use the system, and is provided in the context of a particular application. Various modifications to the disclosed embodiments will be readily apparent to those skilled in the art.

The general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

A class-E differential power amplifier can be provided with an efficient combination of harmonic tuning and impedance matching to a load. The output matching can be combined with the transformer and the inductance of the resonant short.

Figure 1:
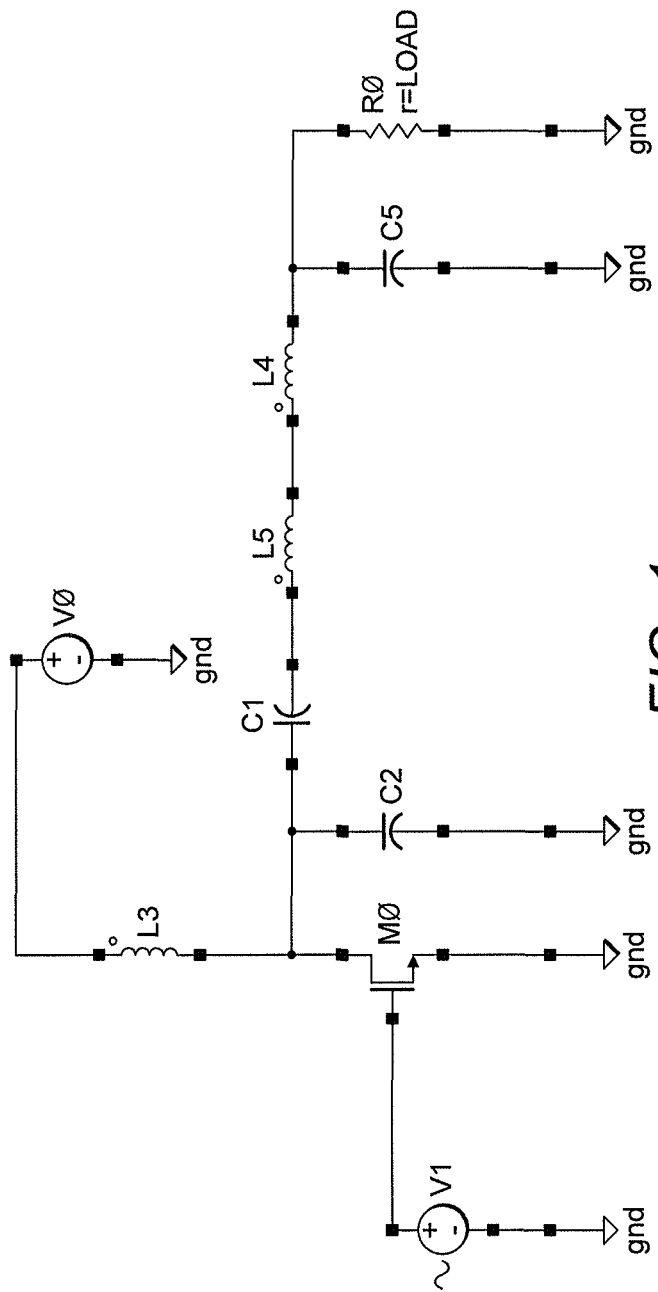
FIG. 1 shows a typical class-E amplifier as is known in the art.
Figure 2:
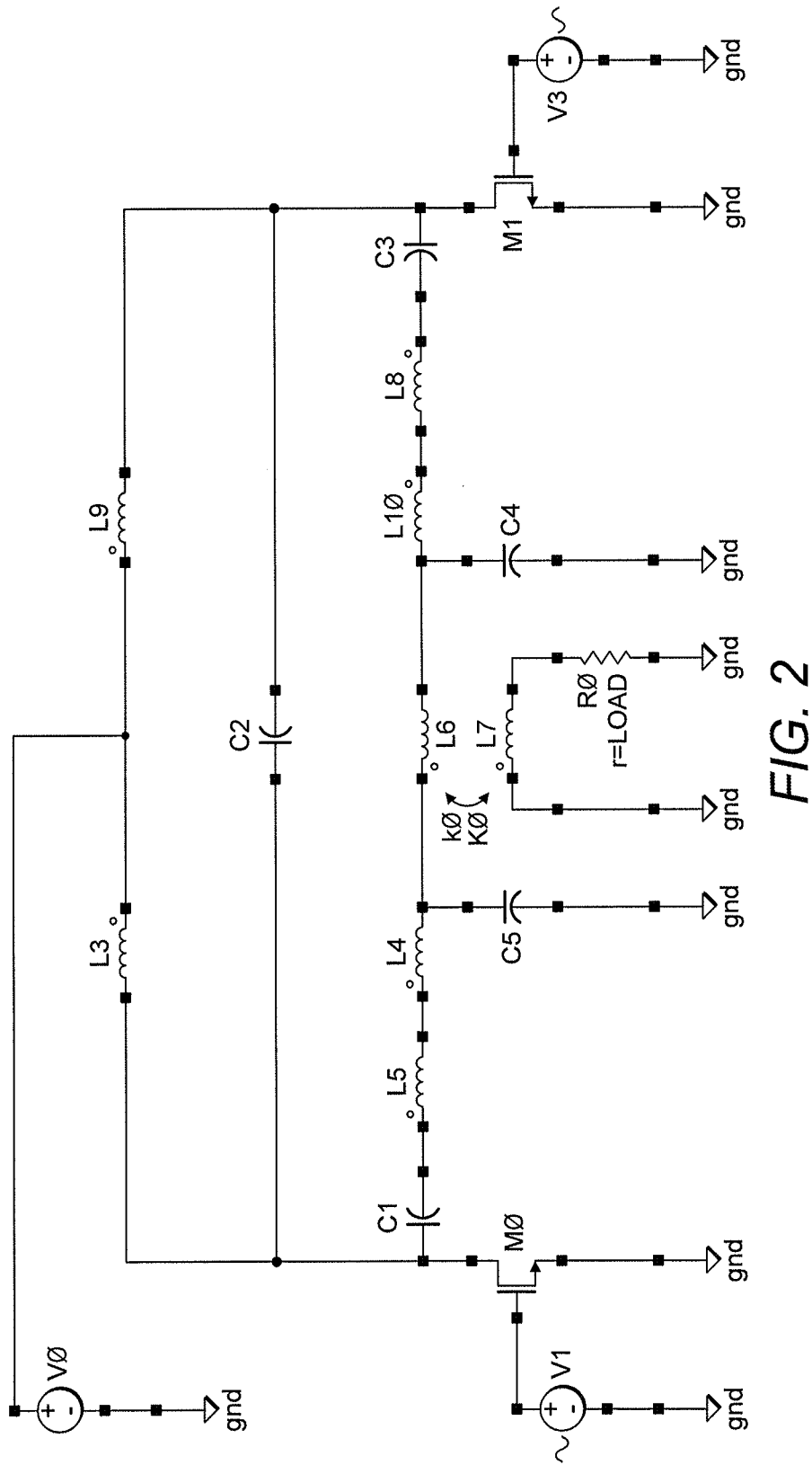
FIG. 2 shows the straightforward differential implementation of the class-E amplifier of FIG. 1.
Figure 3:
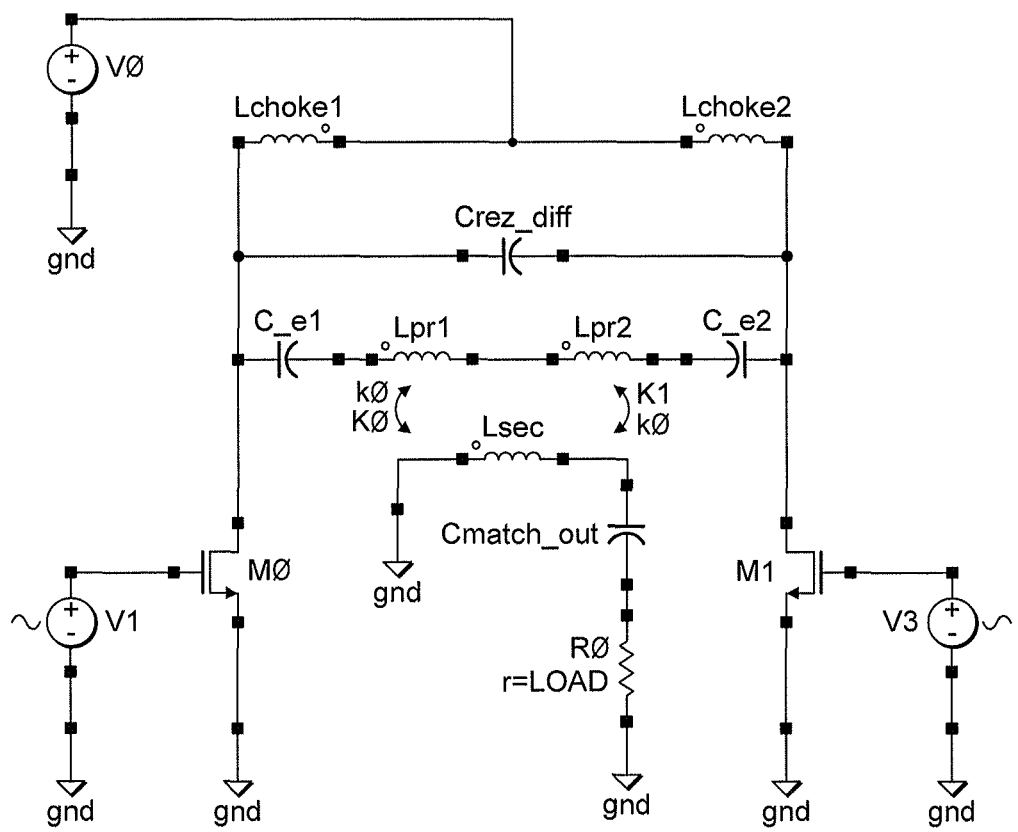
FIG. 3 shows an example circuit optimised for differential class-E amplification.

An example circuit diagram is given in FIG. 3. This circuit contains some components that correspond to some of the components in the prior art differential class-E amplifier of FIG. 2, and as such are labelled similarly. However, the circuit of FIG. 3 requires fewer inductors.

In the circuit of FIG. 2, resonant shorts C1-L5 and C3-L8 are used for harmonic tuning. Inductors L4 and L10 and capacitors C5 and C4 are used to match the outputs of the two amplifiers. These outputs are then combined and coupled to the load RØ using inductor L6 in the output transformer. In contrast, in the circuit of FIG. 3, only two inductances are needed: one symmetrical inductance as differential resonating load, and one output transformer. The output transformer comprising inductors Lpr1, Lpr2 and L_sec and capacitor Cmatch_out combines all three of the above-mentioned functions: acting with capacitors C_e1 and C_e2 for harmonic tuning, providing output matching of the two amplifiers, and coupling to the single-ended load RØ. Therefore the number of inductors used is reduced by three and capacitors C4 and C5 are eliminated in favour of single capacitor Cmatch_out, which together with the inductance ratio of the transformer and the impedance transformation of the secondary inductance performs impedance matching.

Figure 4:
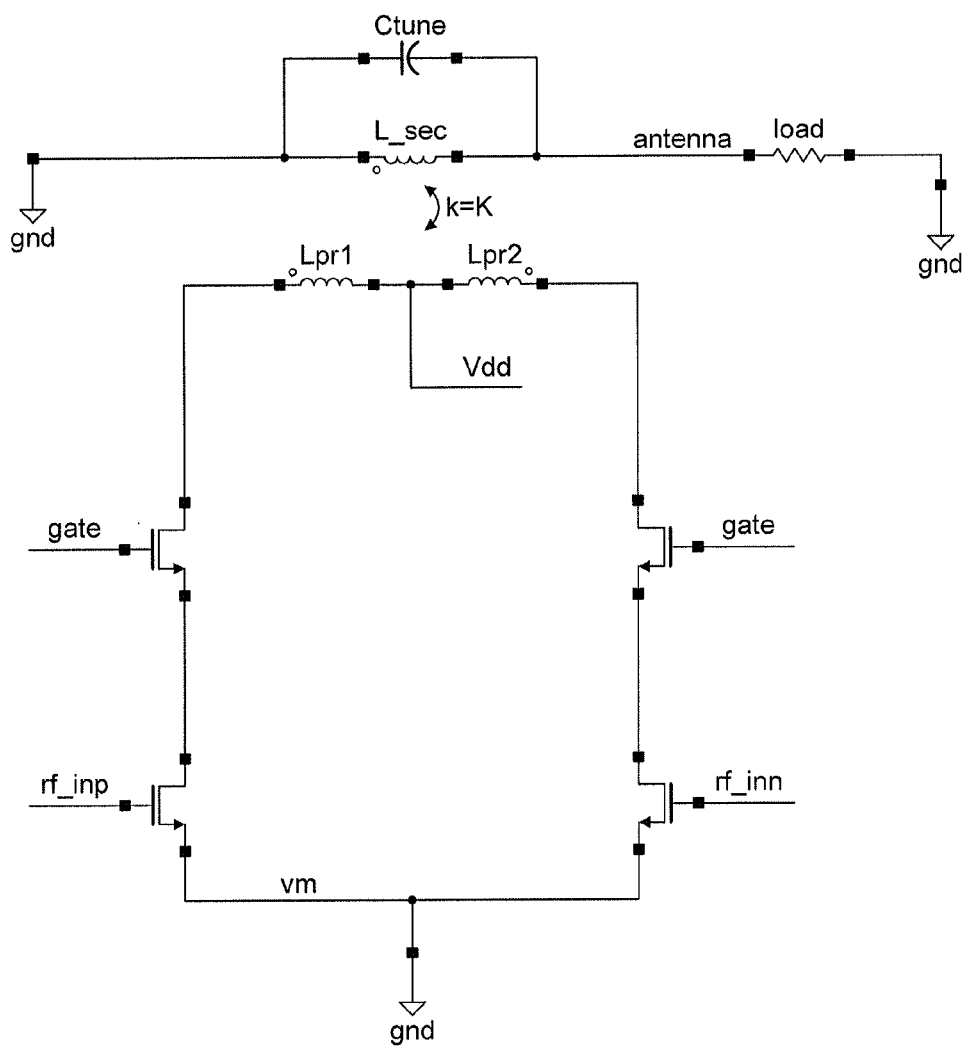
FIG. 4 shows a schematic of the output stage of a radio frequency differential class-AB amplifier.

This implementation also means that the large DC current of the active devices is only handled by the symmetrical inductance—the resonant load of the differential pair. Capacitors C_e1 and C_e2 isolate the output transformer L_pr1, Lpr_2 and L_sec, and hence the power output path, from the DC current. Contrast this to the schematic of the output stage of a prior art radio frequency class-AB differential amplifier shown in FIG. 4 in which the output transformer carries a large DC current.

The circuit could be implemented in a radio frequency transmitter with the load RØ being the antenna, which could, for example have an impedance of 50Ω.

Due to the reduced number of inductors needed the circuit could be fully-integrated, with the entire circuit implemented on a single silicon chip.

Figure 5:
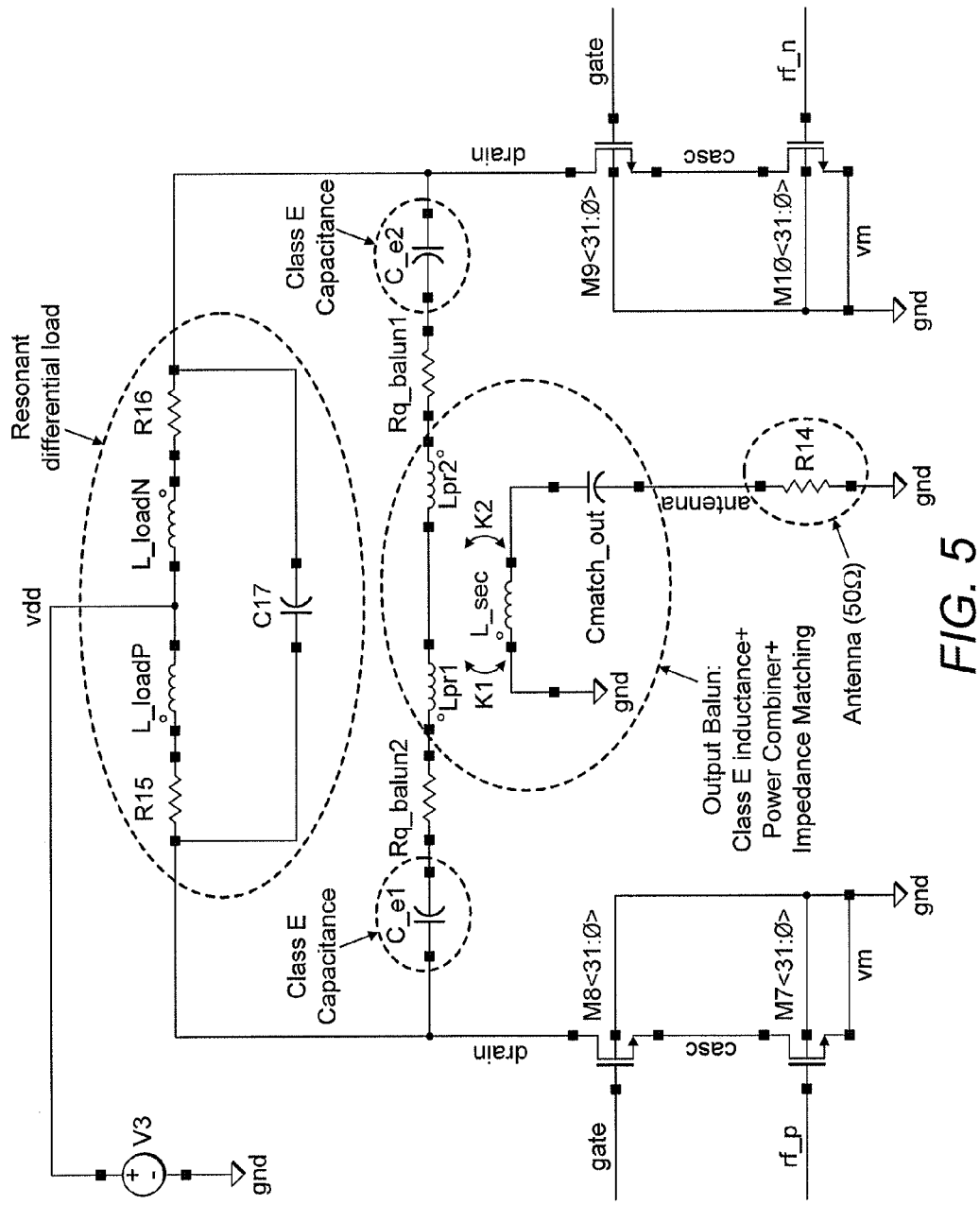
FIG. 5 shows an example circuit as could be used in a radio transmitter.

FIG. 5 shows a test circuit such as could be used in a radio transmitter.

Figure 6A:
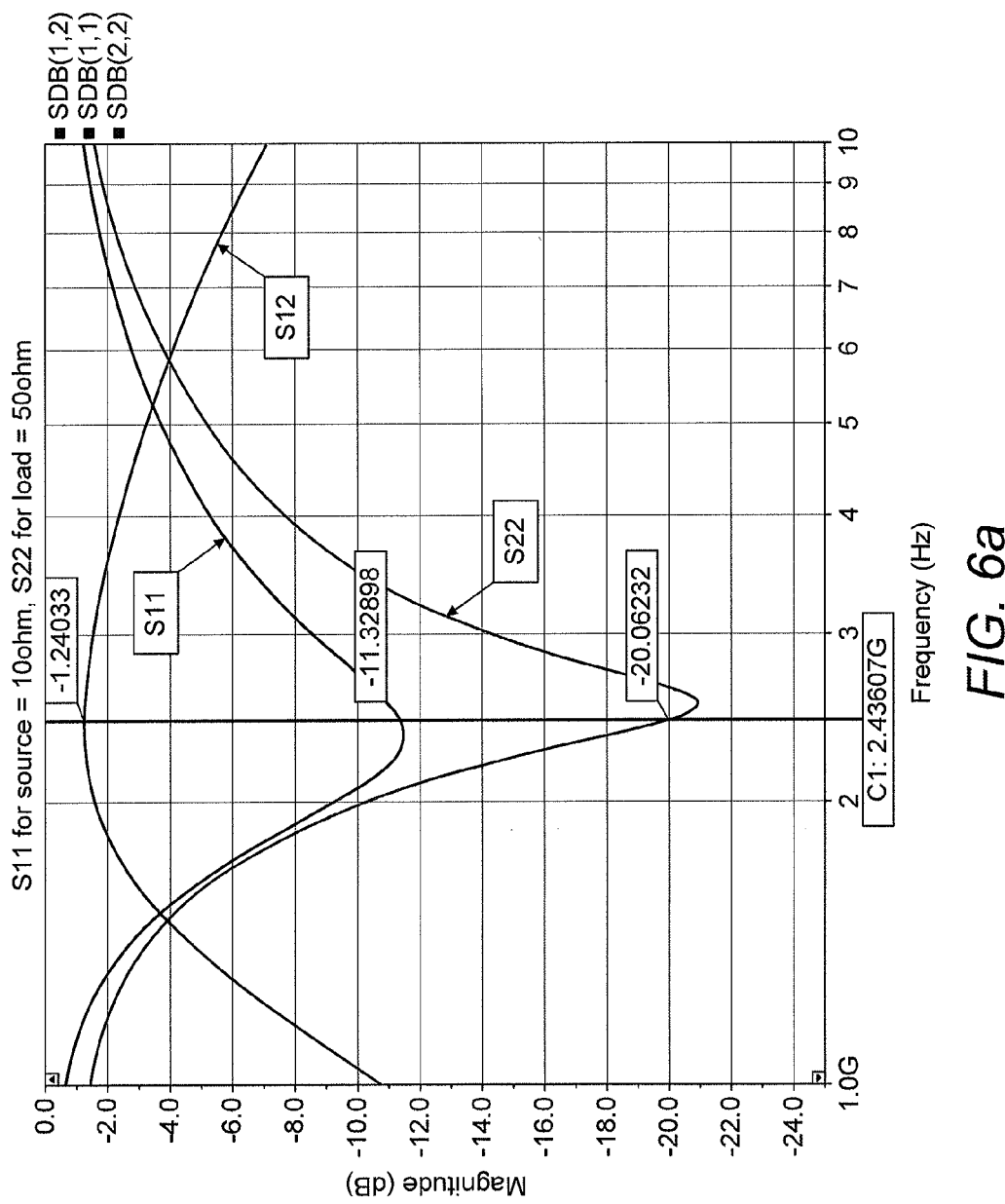
FIGS. 6a, 6b and 6c show simulation results.
Figure 6B:
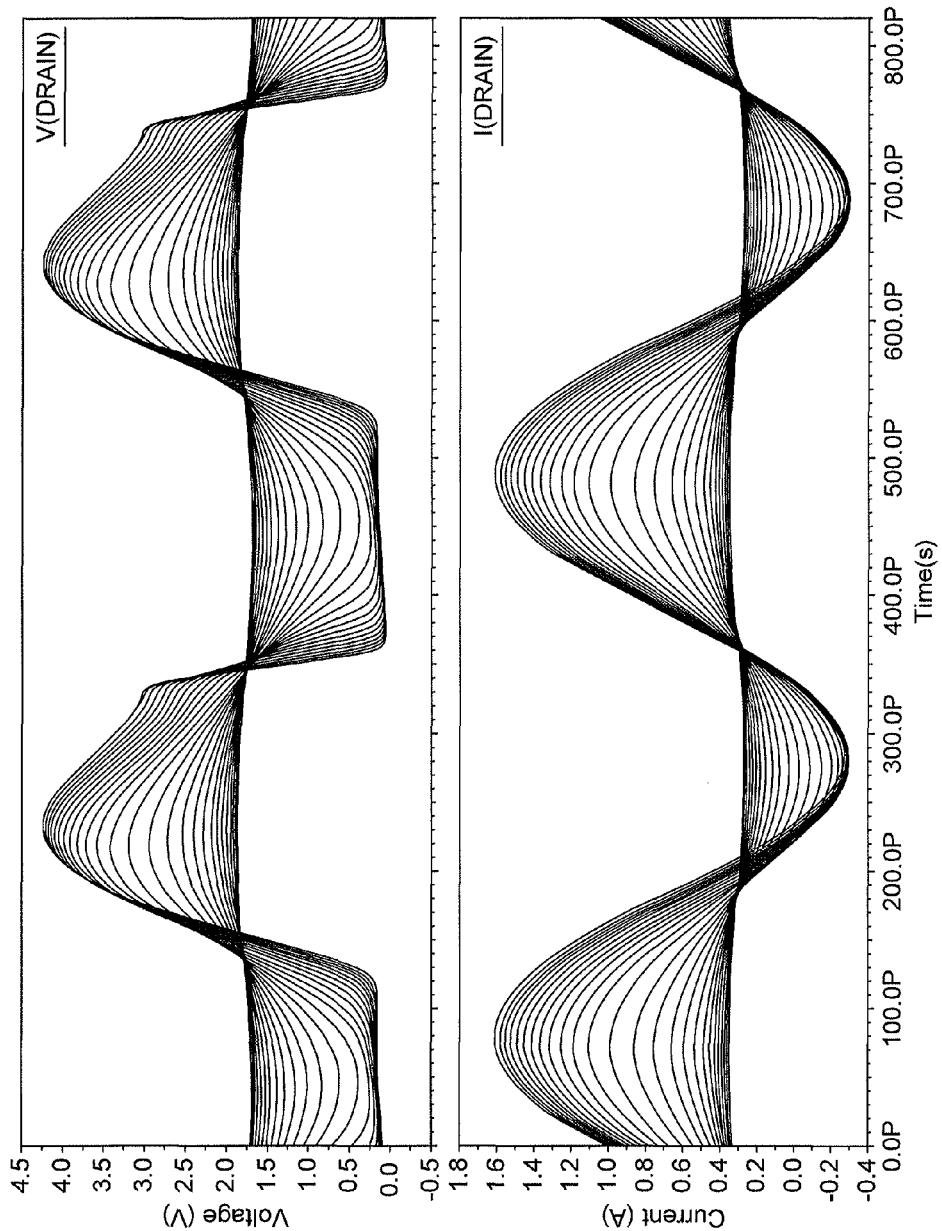
Figure 6C:
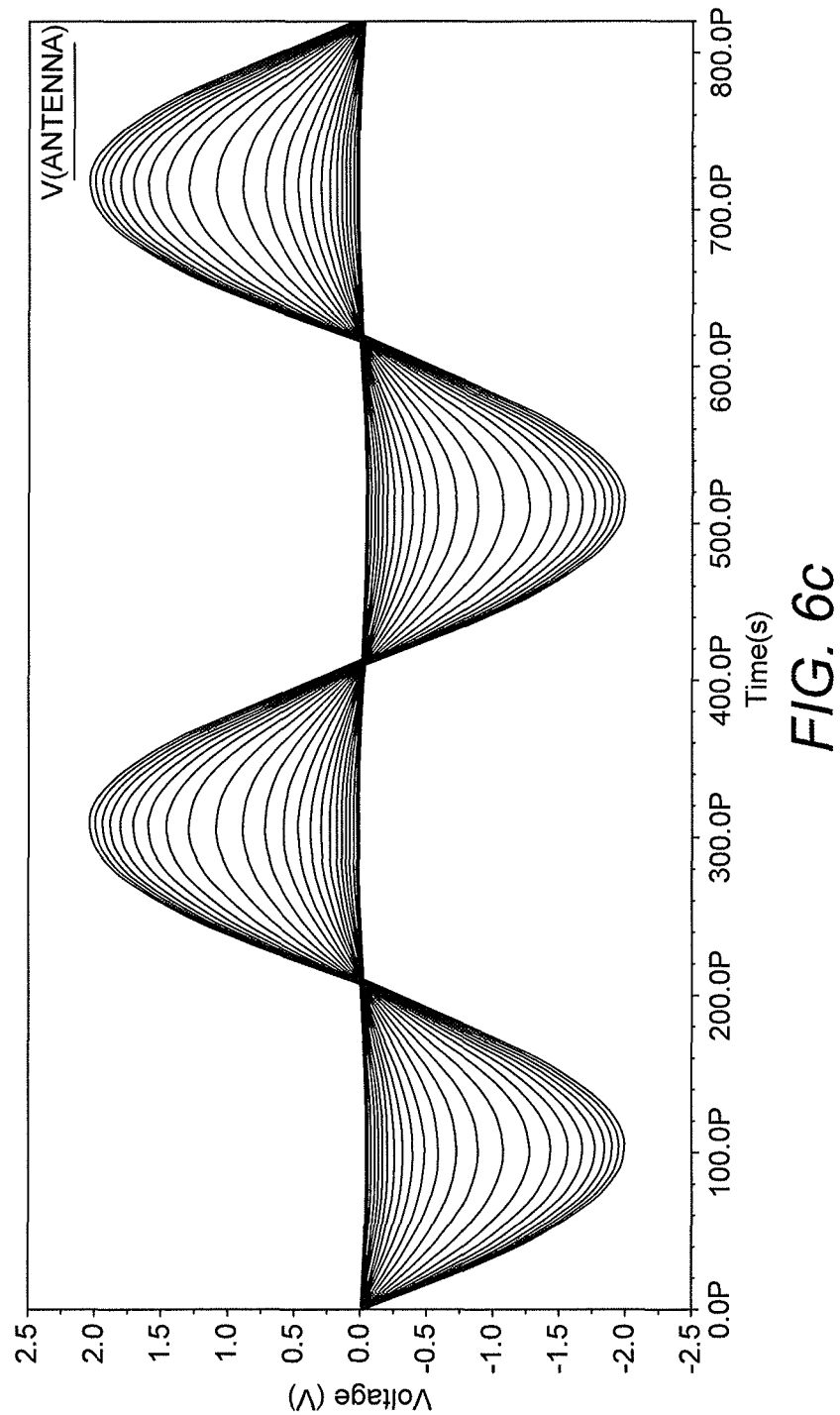

FIGS. 6a, 6b, and 6c show simulation results for such a circuit. FIG. 6a is a graph of S parameters of the output transformer against frequency. It shows reflexion coefficients at source (S11) and load (S22) ports as well as transmission from source to load (S12). The component values inputted were: a primary inductance (Lpr1+Lpr2) of 2.5 nH; secondary inductance of 4 nH (inductance ratio of 1.6); coupling coefficient (KØ, K1) of 0.8; tuning capacitances Cpr, Csec tuning the primary (Lpr1+Lpr2) and secondary (Lsec) sections to the 2.4 GHz band, set at 2.7 pF and 6 pF respectively; with an equivalent quality factor of 13. The results for an impedance transformation of 10Ω (optimum load for 27 dBm and 1.8V supply) to a standard 50Ω antenna load show low insertion losses (S12) of 1.2 dB and a very good reflection coefficient at the antenna (S22) of −20 dB.

FIG. 6b shows simulated waveforms of voltage and current through the power device, and a simulated radio frequency output (antenna) signal for a range of input voltages. FIG. 6c shows the actual signal produced at the antenna, where only the fundamental frequency appears due to frequency selectivity of the load and output transformer.

The proposed architecture has an important advantage for integration: the output transformer only supports the radio frequency current generated by the power amplifier. It is possible to optimise this structure for quality factor and magnetic coupling, which was not the case for the combined load and balun structure typically used in differential Class AB integrated power amplifiers. The large current handling requirements of the power amplifier have been de-correlated from the transformer optimisation.

Implementation alternatives are possible using bipolar (or HBT) transistors; lower supply voltages could accommodate non-cascoded differential amplifiers (similar to that shown in FIG. 3) depending on the technology node.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein, and without limitation to the scope of the claims. The applicant indicates that aspects of the present invention may consist of any such individual feature or combination of features. In view of the foregoing description it will be evident to a person skilled in the art that various modifications may be made within the scope of the invention.

The invention claimed is:

1. A differential electronic amplifier comprising:
    a first switch means connected between a first reference voltage and a first node;
    a second switch means connected between a second reference voltage and a second node;
    a resonant differential load connected between the first and second nodes and having a centre point connected to a third reference voltage;
    an output stage constituted by a first side of a transformer;
    a load impedance connected to a second side of the transformer;
    a first capacitive element connected between the first side of the transformer and the first node; and
    a second capacitive element connected between the first side of the transformer and the second node;
        wherein all inductive elements connected in series between the first and second capacitive elements are inductively coupled to the second side of the transformer.

2. A differential electronic amplifier as claimed in claim 1 wherein one or more of said inductive elements provide impedance matching combining the outputs of two electronic amplifier circuits comprised in the differential electronic amplifier circuit.

3. A differential electronic amplifier as claimed in claim 1, implemented on a single integrated circuit.

4. A differential electronic amplifier as claimed in claim 1, implemented in a radio frequency transmitter circuit.

5. A differential electronic amplifier as claimed in claim 1, wherein the load impedance is an antenna.

6. A differential electronic amplifier as claimed in claim 1, wherein the load impedance is 50 Ohms.

* * * * *